United States Patent [19]
Yamamura et al.

[11] Patent Number: 6,127,085
[45] Date of Patent: *Oct. 3, 2000

[54] PHOTO-CURABLE RESIN COMPOSITION

[75] Inventors: Tetsuya Yamamura; Tsuyoshi Watanabe; Akira Takeuchi; Takashi Ukachi, all of Ibaraki, Japan

[73] Assignees: DSM N.V., Heerlen, Netherlands; JSR Corporation; Japan Fine Coatings Co., LTD, both of Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/953,633

[22] Filed: Oct. 17, 1997

[51] Int. Cl.$^7$ .............................. G03F 7/16; G03F 7/029; G03F 7/004
[52] U.S. Cl. .................. 430/177; 430/280.1; 430/171; 522/170; 522/169; 522/15; 522/25
[58] Field of Search ................................. 430/280.1, 177, 430/171; 522/170, 169, 15, 25

[56] References Cited

U.S. PATENT DOCUMENTS

| | | | |
|---|---|---|---|
| 4,139,655 | 2/1979 | Tsao | 427/44 |
| 4,575,330 | 3/1986 | Hull | 425/174.4 |
| 4,818,776 | 4/1989 | Koleske | 522/31 |
| 5,155,143 | 10/1992 | Koleske | 522/31 |
| 5,434,196 | 7/1995 | Ohkawa et al. | 522/100 |
| 5,476,748 | 12/1995 | Steinmann et al. | 430/280.1 |
| 5,495,029 | 2/1996 | Steinmann et al. | 549/545 |
| 5,707,780 | 1/1998 | Lawton et al. | 430/280.1 |
| 5,739,214 | 4/1998 | Schunck | 525/438 |

FOREIGN PATENT DOCUMENTS

| | | |
|---|---|---|
| 0 509 512 | 10/1992 | European Pat. Off. |
| 0 605 361 | 7/1994 | European Pat. Off. |
| 49-17040 | 2/1974 | Japan |
| 50-151996 | 12/1975 | Japan |
| 50-151997 | 12/1975 | Japan |
| 50-158680 | 12/1975 | Japan |
| 50-158698 | 12/1975 | Japan |
| 52-30899 | 3/1977 | Japan |
| 55-125105 | 9/1980 | Japan |
| 56-8428 | 1/1981 | Japan |
| 55-55420 | 5/1981 | Japan |
| 56-149402 | 11/1981 | Japan |
| 57-192429 | 11/1982 | Japan |
| 60-247515 | 12/1985 | Japan |
| 62-35966 | 2/1987 | Japan |
| 62-101408 | 5/1987 | Japan |
| 63-37034 | 2/1988 | Japan |

(List continued on next page.)

OTHER PUBLICATIONS

13:17 344, Chemical Abstract of Japan 2–75618 issued Mar. 15, 1990, American Chemical Society.
90–127832, WPIDS, English Abstract of Japan 2–75618, issued Mar. 15, 1990, Derwent Information Ltd.
RN 87211–27–6, Registry, American Chemical Society 1998.
RN 25085–98–7, Registry, American Chemical Society, 1998.
RN 15625–89–5, Registry, American Chemical Society, 1998.
Patent Abstracts of Japan, vol. 14, No. 261 (C–0725), Jun. 6, 1990 (abstract of JP–02–075618).

*Primary Examiner*—Cynthia Hamilton
*Attorney, Agent, or Firm*—Pillsbury Madison & Sutro

[57] ABSTRACT

A novel photo-curable resin composition. The resin composition capable of providing a cured product having excellent mechanical strength, high dimensional accuracy, and excellent toughness. The resin composition is capable of providing a cured product which experiences little change in mechanical strength over time. The resin composition is capable of forming, by photo-fabricating, a three-dimensional object which can be used for a long period of time in a humid atmosphere. The composition comprises, (A) an epoxy compound having a cyclohexene oxide, (B) a cationic photo-initiator, (C) an ethylenically unsaturated monomer, (D) a radical photo-initiator, and (E) a polyol.

11 Claims, 1 Drawing Sheet

FOREIGN PATENT DOCUMENTS

| | | |
|---|---|---|
| 63-176337 | 7/1988 | Japan . |
| 63-229381 | 9/1988 | Japan . |
| 1-204915 | 8/1989 | Japan . |
| 1-213304 | 8/1989 | Japan . |
| 2-28261 | 1/1990 | Japan . |
| 2-75618 | 3/1990 | Japan . |
| 2-208305 | 8/1990 | Japan . |
| 3-160013 | 7/1991 | Japan . |
| 5-24119 | 2/1992 | Japan . |
| 6-228413 | 8/1994 | Japan . |
| WO97/42549 | 11/1997 | WIPO . |

FIG. 1

PHOTO-CURABLE RESIN COMPOSITION

BACKGROUND OF THE INVENTION

1. Field of the Invention

The present invention relates to a photo-curable resin composition, especially to a liquid photo-curable resin composition suitable as material used in photo-fabricating processes and capable of providing cured products having a high moisture resistance and excellent toughness.

2. Description of the Background Art

In recent years, photo-fabricating processes for forming three-dimensional objects consisting of integrally laminated cured resin layers prepared by repeating a step of forming a cured resin layer by selectively irradiating a liquid photo-curable material with light have been proposed (see Japanese Patent Application Laid-open No. 247515/1985, U.S. Pat. No. 4,575,330 (Japanese Patent Application Laid-open No. 35966/1987), Japanese Patent Application Laid-open No. 101408/1987, Japanese Patent Application Laid-open No. 24119/1993).

A typical example of such a photo-fabricating process comprises forming a curable resin layer having a specified pattern by selectively irradiating with light using, for example, ultraviolet laser radiation on the surface of a liquid photo-curable material (photo-curable resin composition), according to input data in a CAD system. A further thin layer of the photo-curable resin composition is formed over this cured resin layer, and selectively irradiated to form a newly cured resin layer which is integrally laminated over the previously formed cured resin layer. This step is repeated a number of times, with or without changing the pattern in which the resin composition is irradiated to form a three-dimensional object consisting of integrally laminated multiple cured resin layers. This photo-fabricating process has been attracting considerable attention, because the target three-dimensional object can easily be prepared in a short period of time even if it has a complicated shape.

The following resin compositions (A) to (C) have been reported as the photo-curable resin composition used in the photo-fabricating process.

(A) Resin compositions containing a radically polymerizable organic compound such as urethane(meth)acrylate, oligoester(meth)acrylate, epoxy(meth)acrylate, thiol/ene compounds, photosensitive polyimide, and the like (see Japanese Patent Applications Laid-open No. 204915/1989, No. 208305/1991, and No. 160013/1989).

(B) Resin compositions containing a cationically polymerizable organic compound such as an epoxy compound, cyclic ether compound, cyclic lactone compound, cyclic acetal compound, cyclic thioether compound, spiro-orthoester compound, vinyl ether compound, and the like (see Japanese Patent Application Laid-open No. 213304/1989).

(C) Resin compositions containing a radically polymerizable organic compound and a cationically polymerizable organic compound (see Japanese Patent Applications Laid-open No. 28261/1990, No. 75618/1990, and No. 228413/1994).

The characteristics required of the photo-curable resin composition used for these photo-fabricating processes include a low viscosity to form a smooth liquid level and the capability of being rapidly cured by light irradiation in view of effective photo-fabrication. In addition, the cured photo-curable resin composition should be non-swelling when contacted by a photo-curable resin composition, and experience minimal deformation due to shrinkage during curing with light (i.e. in production of warped parts, indented parts, or stretched parts (overhanging parts).

Three-dimensional objects prepared by photo-fabricating methods have conventionally been used for design models and trial mechanical parts. High dimensional accuracy in accordance with the design in fine processing, mechanical strength (for example, tensile strength), toughness (for example, extensibility exhibited by tensile elongation of over 10%), heat resistance, moisture resistance, and water resistance sufficient to withstand conditions of use are especially required of these three-dimensional objects for the trial mechanical parts.

However, no conventional resin composition can satisfy the above demands. The three-dimensional objects obtained exhibit problems of deformation with the passage of time, such as production of warped parts, or indented parts, or stretched parts (overhanging parts), because of residual strain due to shrinkage during curing. These problems of deformation with the passage of time can be partly solved by the correction of the input data to the CAD system. However, the correction is insufficient to correspond to recent progress in fineness and complication in shape, and to circumstantial variations of use.

Mechanical characteristics of three-dimensional objects prepared by photo-fabrication by using conventional resin compositions containing an epoxy compound are degraded in the course of time in accordance with environmental conditions such as temperature and humidity. Therefore, use of these three-dimensional objects is unsuitable for applications requiring mechanical strength over an extended period of time.

Also, no three-dimensional object prepared by using the conventional resin compositions is provided with mechanical strength, toughness, dimensional accuracy, heat resistance, moisture resistance, water resistance, and the like required for the trial mechanical parts.

The present invention has been achieved in view of this situation and has an object of providing a novel photo-curable resin composition.

Another object of the present invention is to provide a photo-curable resin composition providing cured products which have high mechanical strength, high dimensional accuracy, and excellent toughness.

A further object of the present invention is to provide a photo-curable resin composition providing cured products with lasting minimal deformation characteristics.

A still further object of the present invention is to provide a photo-curable resin composition which can be molded to produce a three-dimensional object suitable for trial mechanical parts.

A still further object of the present invention is to provide a photo-curable resin composition which can be molded to produce a three-dimensional object which can be used under highly moisturized conditions for a long period of time.

SUMMARY OF THE INVENTION

The above objects are acheived in the present invention by employing a photo-curable resin composition comprising,

(A) an epoxy compound having a cyclohexene oxide structure,
(B) a cationic photo-initiator,
(C) an ethylenically unsaturated monomer,
(D) a radical photo-initiator, and
(E) a polyol.

DETAILED DESCRIPTION OF THE INVENTION AND PREFERRED EMBODIMENTS

The photo-curable resin composition of the resent invention comprises, as essential components, an epoxy compound having a cyclohexene oxide structure represented by formula (1)

wherein $R^1$ and $R^2$, which may be the same or different, individually represent a hydrogen atom, methyl group, ethyl group, isopropyl group, n-butyl group, sec-butyl group, or tert-butyl group, s is an integer from 1–7, and t is an integer from 1–20, provided that when there are two or more groups of $R^1$ or $R^2$ present, a plurality of $R^1$ or $R^2$ may be either the same or different, as the component (A), a cationic photo-initiator as the component (B), an ethylenically unsaturated monomer as the component (C), a radical photo-initiator as the component (D), and a polyol as the component (E).

Component (A)

The component (A) contained in the photo-curable resin composition of the present invention is an epoxy compound having a cyclohexene oxide structure. Epoxy compounds which can be used are cationically polymerizable compounds which can start a polymerization reaction and a crosslinking reaction when irradiated with light in the presence of a cationic polymerization initiator.

Typical examples of the epoxy compounds as the component (A) are ε-caprolactone denaturated 3,4-epoxycyclohexylmethyl-3',4'-epoxycyclohexane carboxylate, trimethylcaprolactone denaturated 3,4-epoxycyclohexylmethyl-3',4'-epoxycyclohexane carboxylate, and β-methyl-δ-valerolactone denaturated 3,4-epoxycyclohexylmethyl-3',4'-epoxycyclohexane carboxylate. These compounds may be used as the component (A) either individually or in combinations of two or more. These epoxy compounds can be synthesized, for example, by reacting 3,4-cyclohexenylmethyl-3',4'-cyclohexene carboxylate with a lactone compound and by epoxydating the resulting reaction product with a peracid.

Typical examples of commercially available products of epoxy compounds as the component (A) are CELOXIDE 2081, CELOXIDE 2083, and CELOXIDE 2085 (manufactured by Daicel Chemical Industry Co. Ltd.).

The proportion of the component (A) in the photo-curable resin composition is preferably 5–60% by weight, and more preferably 7–45% by weight. The particularly preferable proportion is 10–35% by weight of the total photo-curable resin composition. If the proportion of the component (A) is too low, no cured product (three-dimensional object) prepared from the resulting resin compositions can exhibit high moisture resistance and excellent toughness (extensibility).

On the other hand, if the proportion of the component (A) is too high, the mechanical strength of cured products (three-dimensional objects) from the resulting resin compositions tends to be low.

Component (B)

The cationic photo-initiator as the component (B) is a compound capable of liberating a molecule initiating cationic polymerization of the component (A) by receiving radiation such as light. Given as examples of the cationic photo-initiator are onium salts illustrated by the following formula (2), which are a compound releasing Lewis acid upon exposure to light:

wherein the cation is onium; Z represents S, Se, Te, P, As, Sb, Bi, O, I, Br, Cl, or N≡N; $R^3$, R, $R^5$, and $R^6$ represent individually the same or a different organic group; a, b, c, and d represent individually an integer from 0 to 3, and the sum of a, b, c, and d (=a+b+c+d) is equal to the valence number of Z. Also, M represents a metal or metalloid which constitutes a center atom of a halide complex. Typical examples of M are B, P, As, Sb, Fe, Sn, Bi, Al, Ca, In, Ti, Zn, Sc, V, Cr, Mn, and Co. X represents a halogen atom. m is a substantial electric charge. Typically, m is an integer having a value of at least 1, preferably 1–3. n is the number of halogen atoms in the complex anion. Typically, n is an integer having a value of at least 1, preferably 2–6.

Given as specific examples of the negative ion ($MX_n^-$) in the above formula (2) are tetrafluoroborate ($BF_4^-$), hexafluorophosphate ($PF_6^-$), hexafluoroantimonate ($SbF_6^-$), hexafluoroarsenate ($AsF_6^-$), and hexachloroantimonate ($SbCl_6^-$).

Also, onium salts containing a negative ion represented by the general formula $[MX_n(OH)^{-1}]$ can be used. X and n are as defined above. Further, onium salts including a negative ion, for example, perchloric acid ion ($Cl_4^-$), trifluoromethane sulfonate ion ($CF_3SO_3^-$), fluorosulfonate ion ($FSO_3^-$), toluene sulfonate ion, trinitrobenzene sulfonate negative ion, and trinitrotoluene sulfonate negative ion are suitable.

The above-mentioned cationic photo-initiators can be used as the component (B) either individually or in combinations of two or more.

Among these onium salts, especially effective onium salts as the component (B) are aromatic onium salts, in which the following compounds are preferable: aromatic halonium salts described, for example, in Japanese Patent Applications Laid-open No. 151996/1975 and No. 158680/1975; VIA group aromatic onium salts described, for example, in Japanese Patent Applications Laid-open No. 151997/1975, No. 30899/1977, No. 55420/1981, and No. 125105/1980; VA group aromatic onium salts described, for example, in Japanese Patent Application Laid-open No. 158698/1975; oxosulfoxonium salts described, for example, in Japanese Patent Applications Laid-open No. 8428/1981, No. 149402/1981, and No. 192429/1982; aromatic diazonium salts described, for example, in Japanese Patent Application Laid-open No. 17040/1974; and thiopyrylium salts described in the specification of U.S. Pat. No. 4,139,655 all of which are hereby incorporated by reference. A Iron/allene complex and aluminum complex/photo-decomposed silica compound initiator are also given as examples of the onium salts.

Given as examples of commercially available products of the cationic photo-initiator are UVI-6950, UVI-6970, UVI-6974, UVI-6990 (manufactured by Union Carbide Corp.), Adekaoptomer SP-150, SP-151, SP-170, SP-171 (manufactured by Asahi Denka Kogyo Co., Ltd.), Irgacure

261 (manufactured by Ciba Geigy), CI-2481, CI-2624, CI-2639, CI-2064 (manufactured by Nippon Soda Co., Ltd.), CD-1010, CD-1011, CD-1012 (manufactured by Satomer Co., Ltd.), DTS-102, DTS-103, NAT-103, NDS-103, TPS-103, MDS-103, MPI-103, BBI-103 (manufactured by Midori Chemical Co., Ltd.). Among these, UVI-6970, UVI-6974, Adekaoptomer SP-170, SP-171, CD-1012, MPI-103 are particularly preferable to develop high curing sensitivity of the resin composition which contains these compounds.

The proportion of the component (B) in the photo-curable resin composition is 0.1–10% by weight, preferably 0.2–5% by weight, and more preferably 0.3–3% by weight. If the proportion of the component (B) is too low, the photo-curing characteristics of the resulting resin composition are insufficient anda three-dimensional objects produced therefrom will have insufficient mechanical strength. Alternatively, if the proportion of the component (B) is too high, an appropriate light transmission capability (curing depth) cannot be obtained when the resulting resin composition is used in the photo-fabricating process. Mechanical strength such as toughness of the three-dimensional object prepared from this resin composition also tends to be lower.

Component C

The ethylenically unsaturated monomer used as the component (C) is a compound having ethylenically unsaturated groups (C═C) in the molecule. Given as typical examples of the component (C) are monofunctional monomers having one ethylenically unsaturated bond in one molecule, and polyfunctional monomers having two or more ethylenic unsaturated bonds in one molecule.

Given as preferred examples of the monofunctional monomers used as the component (C) are acrylamide, (meth)acryloyl morpholine, 7-amino-3,7-dimethyloctyl (meth)acrylate, isobutoxymethyl (meth)acrylamide, isobornyloxyethyl (meth)acrylate, isobornyl (meth)acrylate, 2-ethylhexyl (meth)acrylate, ethyldiethylene glycol (meth) acrylate, t-octyl (meth)acrylamide, diacetone (meth) acrylamide, dimethylaminoethyl (meth)acrylate, diethylaminoethyl (meth)acrylate, lauryl (meth)acrylate, dicyclopentadiene (meth)acrylate, dicyclopentenyloxyethyl (meth)acrylate, dicyclopentenyl (meth)acrylate, N,N-dimethyl (meth)acrylamide tetrachlorophenyl (meth) acrylate, 2-tetrachlorophenoxyethyl (meth)acrylate, tetrahydrofurfuryl (meth)acrylate, tetrabromophenyl (meth) acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth) acrylate, vinyl caprolactam, N-vinyl pyrrolidone, phenoxyethyl (meth)acrylate, butoxyethyl (meth)acrylate, pentachlorophenyl (meth)acrylate, pentabromophenyl (meth)acrylate, polyethylene glycol mono-(meth)acrylate, polypropylene glycol mono-(meth)acrylate, bornyl (meth)acrylate, methyltriethylene diglycol (meth)acrylate, and, the compounds shown in the following general formulas (3) to (5), (3)

(4)

(5)

wherein $R^7$ represents a hydrogen atom or a methyl group, $R^8$ represents an alkylene group containing 2–6, preferably 2–4, carbon atoms, $R^9$ represents an aromatic group, optionally substituted with an alkyl group containing 1–12, preferably 1–9, carbon atoms, $R^{10}$ represents an alkylene group containing 2–8, preferably 2–5, carbon atoms, $R^{11}$ denotes a tetrahydrofuryl group, r denotes an integer from 0–12, preferably from 1–8, and q denotes an integer from 1–8, preferably from 1–4. These monofunctional monomers may be used as the component (C) either individually or in combinations of two or more.

Among these monofunctional monomers, isobornyl (meth)acrylate, lauryl (meth)acrylate, and phenoxyethyl (meth)acrylate are particularly preferable.

Given as examples of commercially available products of the monofunctional monomers are Aronix M-101, M-102, M-111, M-113, M-117, M-152, TO-1210 (manufactured by Toagosei Chemical Co., Ltd.), KAYARAD TC-110S, R-564, R-128H (manufactured by Nippon Kayaku Co., Ltd.), and Viscoat 192, Viscoat 220, Viscoat 2311HP, Viscoat 2000, Viscoat 2100, Viscoat 2150, Viscoat 8F, Viscoat 17F (manufactured by Osaka Organic Chemical Industry, Co., Ltd.).

Given as preferred examples of the polyfunctional monomers used as the component (C) are di(meth)acrylate compounds such as ethylene glycol di(meth)acrylate, dicyclopentenyl di(meth)acrylate, triethylene glycol diacrylate, tetraethylene glycol di(meth)acrylate, tricyclodecanediyldimethylene di(meth)acrylate, tris(2-hydroxyethyl) isocyanurate di(meth)acrylate, tripropylene glycol di(meth) acrylate, neopentyl glycol di(meth)acrylate, both terminal (meth)acrylic acid adduct of bisphenol A diglycidyl ether, 1,4-butanediol di(meth)acrylate, 1,6-hexanediol di(meth) acrylate, polyester di(meth)acrylate, polyethylene glycol di(meth)acrylate, ethylene oxide adduct bisphenol A di(meth)acrylate, propylene oxide adduct bisphenol A di(meth)acrylate, ethylene oxide adduct hydrogenated bisphenol A di(meth)acrylate, propylene oxide adduct hydrogenated bisphenol A di(meth)acrylate, and ethylene oxide adduct bisphenol F di(meth)acrylate; tri(meth)acrylate compounds such as tris(2-hydroxyethyl)isocyanurate tri (meth)acrylate, caprolactone denaturated tris(2-hydroxyethyl)isocyanurate tri(meth)acrylate, trimethylolpropane tri(meth)acrylate, ethylene oxide adduct trimethylolpropane tri(meth)acrylate, propylene oxide adduct trimethylolpropane tri(meth)acrylate, and pentaerythritol tri(meth)acrylate; tetra(meth)acrylate compounds such as pentaerythritol tetra(meth)acrylate, dipentaerythritol tetra(meth)acrylate, and ditrimethylolpropane tetra(meth)acrylate; penta(meth)acrylate compounds such as dipentaerythritol penta(meth)acrylate, caprolactone denaturated dipentaerythritol, and penta(meth)acrylate; hexa(meth) acrylate compounds such as dipentaerythritol hexa(meth) acrylate and caprolactone denaturated dipentaerythritol hexa (meth)acrylate; and (meth)acrylate of phenol novolak polyglycidyl ether. These polyfunctional monomers may be used as the component (C) either individually or in combinations of two or more.

Among these polyfunctional monomers, the following compounds are particularly preferable: trimethylolpropane tri(meth)acrylate, ethylene oxide adduct trimethylolpropane tri(meth)acrylate, propylene oxide adduct trimethylolpropane tri(meth)acrylate, pentaerythritol tri(meth)acrylate, pentaerythritol tetra(meth)acrylate, dipentaerythritol hexa(meth)acrylate, dipentaerythritol penta(meth)acrylate, dipentaerythritol tetra(meth)acrylate, caprolactone denaturated dipentaerythritol hexa(meth)acrylate, caprolactone denaturated dipentaerythritol penta(meth)acrylate, and ditrimethylolpropanetetra (meth)acrylate.

Given as commercially available products of these polyfunctional monomers are SA1002 (manufactured by Mitsubishi Chemical Corp.), Viscoat 195, Viscoat 230, Viscoat 260, Viscoat 215, Viscoat 310, Viscoat 214HP, Viscoat 295, Viscoat 300, Viscoat 360, Viscoat GPT, Viscoat 400, Viscoat 700, Viscoat 540, Viscoat 3000, Viscoat 3700 (manufactured by Osaka Organic Chemical Industry Co., Ltd.), Kayarad R-526, HDDA, NPGDA, TPGDA, MANDA, R-551, R-712, R-604, R-684, PET-30, GPO-303, TMPTA, THE-330, DPHA, DPHA-2H, DPHA-2C, DPHA-2I, D-310, D-330, DPCA-20, DPCA-30, DPCA-60, DPCA-120, DN-0075, DN-2475, T-1420, T-2020, T-2040, TPA-320, TPA-330, RP-1040, RP-2040, R-011, R-300, R-205 (manufactured by Nippon Kayaku Co., Ltd.), Aronix M-210, M-220, M-233, M-240, M-215, M-305, M-309, M-310, M-315, M-325, M-400, M-6200, M-6400 (manufactured by Toagosei Chemical Co., Ltd.), Light acrylate BP-4EA, BP-4PA, BP-2EA, BP-2PA, DCP-A (manufactured by Kyoeisha Chemical Industry Co., Ltd.), New frontier BPE-4, TEICA, BR-42M, GX-8345 (manufactured by Daiichi Kogyo Seiyaku Co., Ltd.), ASF-400 (manufactured by Nippon Steel Chemical Co., Ltd.), Ripoxy SP-1506, SP-1507, SP-1509, VR-77, SP-4010, SP-4060 (manufactured by Showa Highpolymer Co., Ltd.), and NK ester A-BPE-4 (manufactured by Shin Nakamura Chemical Industry Co., Ltd.).

It is desirable that the polyfunctional monomers having three or more ethylenically unsaturated bonds in one molecule be used as all or part of the component (C). The proportion of the polyfunctional monomer having three or more functional groups in the component (C) is preferably more than 60% by weight and more preferably more than 80% by weight of component (C) present in the photo-curable composition. A particularly preferable proportion of the polyfunctional monomer is 100% by weight of component (C) present in the photo-curable composition. If the proportion of the polyfunctional monomer having three or more functional groups is less than 60% by weight of component (C) present in the photo-curable composition, the photo-curing characteristic of the resulting resin composition are insufficient and the molded three-dimensional object tends to be deformed with time.

The polyfunctional monomer having three or more polyfunctional groups can be selected from the above-mentioned tri(meth)acrylate compounds, tetra(meth)acrylate compounds, penta(meth)acrylate compounds, and hexa(meth)acrylate compounds. Among these, trimethylol propane tri(meth)acrylate, ethylene oxide adduct trimethylolpropane tri(meth)acrylate, dipentaerythritol hexa(meth)acrylate, dipentaerythritol penta(meth)acrylate, and ditrimethylolpropane tetra(meth)acrylate are particularly preferable.

The proportion of the component (C) in the photo-curable resin composition of the present invention is generally 5–40% by weight, preferably 7–25% by weight, and more preferably 10–20% by weight. If the proportion of the component (C) in the photo-curable resin composition is too low, the photo-curing characteristics of the resin composition are insufficient. No three-dimensional object having sufficient mechanical strength can be molded from such a resin composition. On the other hand, if the proportion of the composition (C) is too high, the resulting resin composition shrinks easily during photo-curing and the toughness elongation properties of the three-dimensional object tends to be reduced.

Component (D)

The radical photo-initiator which is the component (D) of the resin composition of the present invention is a compound which decomposes and generates radicals on receiving radiation such as light and initiates a radical reaction of the component (C) by the action of the radicals.

Given as specific examples of the radical photo-initiators which can be used as the component (D) are acetophenone, acetophenone benzyl ketal, anthraquinone, 1-(4-isopropylphenyl)-2-hydroxy-2-methylpropane-1-one, carbazole, xanthone, 4-chlorobenzophenone, 4,4'-diaminobenzophenone, 1,1-dimethoxydeoxybenzoin, 3,3'-dimethyl-4-methoxybenzophenone, thioxanethone compounds, 2-methyl-1-[4-(methylthio) phenyl]-2-morpholino-propane-2-on, 2-benzyl-2-dimethylamino-1-(4-morpholinophenyl)-butane-1-one, triphenylamine, 2,4,6-trimethylbenzoyl diphenylphosphine oxide, bis(2,6-dimethoxybenzoyl)-2,4,4-tri-methylpentylphosphine oxide, benzyl dimethyl ketal, 1-hydroxycyclohexylphenyl ketone, 2-hydroxy-2-methyl-1-phenylpropane-1-one, fluorenone, fluorene, benzaldehyde, benzoin ethyl ether, benzoin propyl ether, benzophenone, Michler's ketone, 3-methylacetophenone, 3,3',4,4'-tetra (t-butyl peroxycarbonyl) benzophenone (BTTB), and combined compositions of BTTB and xanthene, thioxanthene, cumarin, ketocumarin or other coloring matter photosensitizer. These compounds may be used either individually or in combinations of two or more.

Among these, benzyl methyl ketal, 1-hydroxycyclohexylphenyl ketone, 2,4,6-trimethylbenzoyl diphenylphosphine oxide, 2-benzyl-2-dimethylamino-1-(4-morpholinophenyl)-butane-1-one, and the like are particularly preferred.

The proportion of the component (D) in the photo-curable resin composition of the present invention is usually 0.01–10% by weight and preferably 0.1–8% by weight. If the proportion of the component (D) is too low, the rate (curing rate) of the radical polymerization reaction is so reduced that molding time may be extended and the resolution may tend to be lower. On the other hand, if the proportion of the component (D) is too high, the excess polymerization initiator sometimes has an adverse effect on the curing characteristics of the resin composition and on the specifications, heat resistance, and handling of the three-dimensional object obtained from the resin composition.

Component (E)

The polyol used as component (E) provides, at least in part, the photo-curability of the resin composition, the shape stability (resistance to deformation with time) and stability in properties (resistance to change in mechanical strength with time) of the three-dimensional object obtained from the resin composition. The polyol used as the component (E) has two or more, preferably 3 to 6 hydroxyl groups in one olecule. If polyols having 6 or more hydroxyl groups are used, the elongation and toughness of the three-imensional object obtained from the resin composition ends to be lower.

Given as specific examples of the component (E) are polyether polyols prepared by the addition reaction of polyhydric alcohol of a valence greater than 3 such as trimethylolpropane, glycerol, pentaerythritol, sorbitol, sucrose, quodrol, or the like with a cyclic ether compound such as ethylene oxide, propylene oxide, butylene oxide, tetrahydrofuran, or the like; polycaprolactone polyols prepared by the reaction of the above polyhydric alcohol with caprolactone; and polyester polyols prepared by the reaction of the above polyhydric alcohol with polyesters consisting of a dibasic acid and a diol. Specific examples of such polyether polyols are ethylene oxide adduct trimethylolpropane, propylene oxide adduct trimethylolpropane, tetrahydrofuran denaturated trimethylolpropane, caprolactone denaturated trimethylolpropane, ethylene oxide adduct glycerol, propylene oxide adduct glycerol, tetrahydrofuran denatured glycerol, caprolactone modified glycerol, ethylene oxide adduct pentaerythritol, propylene oxide adduct pentaerythritol, tetrahydrofuran modified pentaerythritol, caprolactone modified pentaerythritol, ethylene oxide adduct sorbitol, propylene oxide adduct sorbitol, caprolactone modified sorbitol, ethylene oxide adduct sucrose, propylene oxide adduct sucrose, ethylene oxide adduct adduct quodor, and propylene oxide adduct quodor. These compounds may be used either individually or in combinations of two or more. Among these, ethylene oxide adduct trimethylolpropane, propylene oxide adduct trimethylolpropane, caprolactone modified trimethylolpropane, propylene oxide adduct glycerol, caprolactone modified glycerol, and propylene oxide adduct sorbitol are desirable.

The preferable molecular weight of the polyol is 100 to 2,000, and more preferably 160–1,000. If polyether polyols having too small a molecular weight are used as the component (E), it is difficult to prepare a three-dimensional object with stable shape and properties. On the other hand, if polyols having too large a molecular weight are used as the component (E), the viscosity of the resulting resin composition becomes too large, resulting in lowering of the mechanical strength of the three-dimensional object obtained by the photo-fabricating process.

Given as specific examples of commercially available products of the polyols which can be used as the component (E) are Sunnix TP-400, Sunnix GP-600, Sunnix GP-1000, Sunnix SP-750, Sunnix GP-250, Sunnix GP-400, Sunnix GP-600 (manufactured by Sanyo Chemical Industries, Ltd.), TMP-3 Glycol, PNT-4 Glycol, EDA-P-4, EDA-P-8 (manufactured by Nippon Nyukazai Co., Ltd.), G-300, G-400, G-700, T-400, EDP-450, SP-600, SC-800 (manufactured by Asahi Denka Kogyo Co., Ltd.), TONE 0301, TONE 0305, TONE 0310 (manufactured by Union arbide Corp.), and PLACCEL 303, PLACCEL 305, PLACCEL 308 (manufactured by Daicel Chemical Industry, Ltd.).

The proportion of the component (E) in the photo-curable resin composition of the present invention is usually 5–40% by weight, preferably 6–25% by weight, and more preferably 7–20% by weight. If the proportion of the component (E) is too low, the aim of developing the photo-curing characteristic cannot be achieved and there are cases where a three-dimensional object with sufficient stability in shape and properties cannot be produced depending on the resulting resin composition. Also, the toughness of the three-dimensional object tends to be lower. On the other hand, if the proportion of the component (E) is too high, there is a tendency for the mechanical strength of a three-dimensional object prepared by the photo-fabricating process to be reduced and for the resulting three-dimensional object to be softened by moisture or water.

Optional Components

In addition to the above-mentioned components (A) to (E), various other components may be incorporated into the photo-curable resin composition of the present invention to the extent that the photo-curability of this composition is not adversely affected. Such optional components include cationically polymerizable organic compounds other than the above-mentioned component (A).

Typical examples of such cationically polymerizable organic compounds are epoxy compounds, oxetane compounds, oxalan compounds, cyclic acetal compounds, cyclic lactone compounds, thiirane compounds, thietane compounds, vinylether compounds, spiro-ortho ester compounds which are reaction products of an epoxy compound and lactone, ethylenic unsaturated compounds, cyclic ether compounds, cyclic thioether compounds, and vinyl compounds.

Given as examples of the epoxy compounds which can be used as the optional component are 3,4-epoxycyclohexyl methyl-3',4'-epoxycyclohexane carboxylate, 2-(3,4-epoxycyclohexyl-5,5-spiro-3,4-epoxy)cyclohexane-methdioxane, bis(3,4-epoxycyclohexylmethyl) adipate, vinyl cyclohexene oxide, 4-vinyl epoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylene bis(3,4-epoxycyclohexane), dicyclopentadiene diepoxide, di(3,4-epoxycyclohexylmethyl) ether of ethylene glycol, ethylene bis(3,4-epoxy cyclohexane carboxylate), epoxidated tetrabenzyl alcohol, lactone modified epoxidated tetrahydrobenzyl alcohol, cyclohexene oxide, diglycidyl ethers such as bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, an epoxy novolak resin, 1,4-butanediol diglycidyl ether, 1,6-hexanediol diglycidyl ether, glycerol triglycidyl ether, trimethylolpropane triglycidyl ether, polyethylene glycol diglycidyl ether, and polypropylene glycol diglycidyl ether; polyglycidyl esters of polyols prepared by adding one or more alkylene oxides to aliphatic polyhydric alcohol such as ethylene glycol, propylene glycol, and glycerol; diglycidyl esters of aliphatic long chain dibasic acid; monoglycidyl ethers of aliphatic higher alcohol; monoglycidyl ethers of phenol, cresol, or polyether alcohol prepared by adding alkylene oxide to these; glycidylesters of higher fatty acid; epoxidated soybean oil, butylepoxy stearate, octylepoxy stearate, epoxidated linseed oil, and epoxidated polybutadiene.

Typical examples of the oxetane compounds usable as the optional component are trimethylene oxide, 3,3-dimethyloxetane, 3,3-dichloromethyloxetane, 3-ethyl-3-phenoxymethyloxetane, and bis(3-ethyl-3-methyloxy) butane.

Typical examples of the oxalan compounds usable as the optional component are tetrahydrofuran and 2,3-dimethyltetrahydrofuran.

Typical examples of the cyclic acetal compounds usable as the optional component are trioxane, 1,3-dioxalan, and 1,3,6-trioxane cyclooctane.

Typical examples of the cyclic lactone compounds usable as the optional component are—propyolactone and—caprolactone.

Typical examples of the thiirane compounds usable as the optional component are ethylene sulfide, 1,2-propylene sulfide, and thioepichlorohydrin.

Typical examples of the thietane compounds usable as the optional component are 3,3-dimethylthietane.

Typical examples of the vinylether compounds usable as the optional component are ethylene glycol divinyl ether, triethylene glycol divinyl ether, and trimethylolpropane trivinyl ether.

Typical examples of the ethylenic unsaturated compounds usable as the optional component are vinyl cyclohexane, isobutylene, and polybutadiene.

Optional components other than the above cationic polymerizable organic compounds include photosensitizers (polymerization promoters) of amine compounds such as triethanolamine, methyl diethanolamine, triethylamine, and diethylamine; photosensitizers including thioxantone or its derivatives, anthraquinone or its derivatives, anthracene or its derivatives, perillene and its derivatives, benzophenone, benzoin isopropylether, and the like; and reaction diluents such as vinyl ether, vinyl sulfide, vinyl urethane, and vinyl urea; polymers or oligomers, such as epoxy resin, polyamide, polyamideimide, polyurethane, polybutadiene, polychloroprene, polyether, polyester, styrene-butadiene-styrene block copolymer, petroleum resin, xylene resin, ketone resin, cellulose resin, fluorine-containing oligomer, silicon-containing oligomer, and polysulfide oligomer; polymerization inhibitors such as phenothiazine and 2,6-di-t-butyl-4-methyl phenol; polymerization initiation adjuvants, anti oxidants, leveling agents, wettability improvers, surfactants, plasticizers, UV stabilizers, UV absorbers, silane coupling agents, pigments, dyes, inorganic fillers, organic fillers, and the like.

Given as specific examples of the above inorganic fillers used as the optional component are solid microparticles of inorganic compounds, such as glass beads, talc microparticles, and silicon oxide, and whiskers of basic magnesium sulfonate, aluminum oxide, or silicon oxide. Specific examples of the above organic fillers used as the optional component are organic solid microparticles of crosslinked polystyrene high polymer, crosslinked polymethacrylate high polymer, crosslinked polyethylene high polymer, and crosslinked polypropylene high polymer. Also, products from such inorganic fillers or organic fillers treated with a silane coupling agent such as aminosilane, epoxysilane, and acrylsilane can be utilized.

The photo-curable resin composition of the present invention can be manufactured by homogeneously blending the above-mentioned components (A) to (E) and the optional components. It is desirable for the photo-curable resin composition of the present invention to possess a viscosity in the range of 50–1,000 cps, preferably 70–500 cps, at 25° C.

If the viscosity at 25° C. of the resulting photo-curable resin composition is too low, there are cases where the flatness of liquid level of the resin composition is lost. Alternatively, if the viscosity at 25° C. of the photo-curable resin composition is too high, there are cases where no three-dimensional object with high dimensional accuracy can be prepared because a smooth and thin layer of the resin composition can be produced only with difficulty.

Photo-fabricating Process

The photo-curable resin composition of the present invention prepared in this manner is suitable as a (liquid) photo-curable material used in photo-fabricating processes. Specifically, using the photo-fabricating process, including selectively irradiating visible light, ultraviolet light, or infrared light on the photo-curable resin composition of the present invention, a three-dimensional object with a desired shape can be obtained as a product in which the cured resin layers are integrally laminated.

Various means may be used to selectively irradiate the photo-curable resin composition with light with no specific limitations. Such light irradiation means include, for example, a laser beam, a means for irradiating the composition with light and the like converged by a lens, mirror, or the like, while scanning, a means irradiating the composition with non-convergent light through a mask provided with a fixed pattern through which light is transmitted, and a means for irradiating the composition with light via a number of optical fibers bundled in a light conductive member corresponding to a fixed pattern. In the means using a mask, the mask electrooptically produces a mask image consisting of a light transmitting area and a non-light-transmitting area according to a prescribed pattern by the same theory as that of the liquid crystal display apparatus. A means using a scanning laser beam with a small spot size is preferred for selectively irradiating the resin composition with light, when a resulting three-dimensional object possesses minute parts or when high dimensional accuracy is required to form the three-dimensional object.

In the above means, the irradiated surface (for example, the plane scanned by light) of the resin composition placed in a vessel is either the liquid level of the resin composition or the surface at which the liquid contacts with the wall of a transparent vessel. When the irradiated surface is the liquid level or the contact surface of the wall of the vessel, the light shines directly out of the vessel or through the vessel.

In the above photo-fabricating process, a desired solid shape can be made by curing fixed parts of the resin composition and then moving the light spot from the cured parts to the uncured parts continuously or gradually to laminate the cured parts. There are various methods for moving the light spot, for example, a method for moving any of the light source, the vessel for the resin composition, or the cured parts of the resin composition. Also there is a method in which fresh resin composition is supplied to the cured resin composition in the vessel.

Illustrating a typical photo-fabricating process, the surface of a support stage capable of being optionally elevated in the vessel is lowered quite a distance from the liquid surface to form a thin layer (1) of the resin composition, the thin layer (1) is selectively irradiated with light to form a solid cured resin layer (1'), the resin composition is supplied over this thin layer (1') to form a second thin layer (2), and this thin layer (2) is selectively irradiated with light to laminate a new solid cured resin layer (2') on the thin layer (1'). This step is repeated for a prescribed number of times, with or without changing the pattern subjected to light irradiation, to produce a three-dimensional object consisting of a multiple number of cured resin layers (n') which are integrally laminated.

The three-dimensional object molded in this manner is discharged from the vessel and processed to remove the unreacted photo-curable resin composition remaining on the surface, and washed by a solvent, as required. Given as examples of solvents are an organic solvent which is represented by an alcohol, such as isopropyl alcohol or ethyl alcohol, an organic solvent such as acetone, ethyl acetate, methylethyl ketone, an aliphatic organic solvent such as a terpene, or a low viscosity liquid thermosetting resin or photo-curable resin.

When forming a three-dimensional object with a smooth surface, it is desirable that the cured product be washed using the thermosetting resin or photo-curable resin. In this case, it is necessary to post-cure the product by heat emission or light irradiation depending on the type of solvent used in the washing stage. This post-curing treatment is effective not only for curing the resin remaining uncured on the surface of the laminated body, but also for curing the resin composition which remains uncured inside the laminated body. Thus, the post-curing treatment is also effective in the case where the molded three-dimensional object is washed with an organic solvent.

After washing, it is desirable to cover the surface of the three-dimensional object with a heat-curable or photocurable hard coating agent to improve the strength and heat resistance of the surface. As such a hard coating agent, an organic coating agent such as acryl resin, epoxy resin, silicon resin, or the like, or an inorganic coating agent can be used. These hard coating agents may be used individually or in combinations of two or more.

The three-dimensional object (cured product from the composition of the present invention) obtained in this manner has high mechanical strength, high dimensional accuracy, and excellent toughness elongation. Also, the three-dimensional object exhibits high stability in maintaining a fixed shape and lasting stable properties. Therefore, the three-dimensional object prepared from the resin composition is preferably used for trial products of mechanical parts.

EXAMPLES

The present invention will be explained in more detail by way of examples, which are not intended to be limiting of the present invention.

Examples 1–4

According to the formulation shown in Table 1, the components (A)–(E) and the epoxy compound as the optional component were placed in a vessel equipped with a stirrer and the mixture was agitated at 60° C. for 1 hour to prepare a transparent liquid composition as the photocurable resin composition of the present invention. The viscosity of the resulting liquid composition was measured at 25° C. using a B-type viscometer. The results are shown in Table 1.

Comparative Example 1

According to the formulation shown in Table 1, the components (B)–(E) and the epoxy compound were placed in a vessel equipped with a stirrer and the mixture was agitated at 60° C. for 1 hour to prepare a transparent liquid composition as the photo-curable resin composition of the present invention. This Comparative Example 1 represents an example in which the epoxy compound (component (A)) represented by the formula (1) is not used. The viscosity of the resulting liquid composition was measured at 25° C. using a B-type viscometer. The results are shown in Table 1.

Comparative Example 2

According to the formulation shown in Table 1, the components (A)–(D) and the epoxy compound were placed in a vessel equipped with a stirrer and the mixture was agitated at 60° C. for 1 hour to prepare a transparent liquid composition as the photo-curable resin composition of the present invention. This Comparative Example 2 represents an example in which the component (E)) is not used. The viscosity of the resulting liquid composition was measured at 25° C. using a B-type viscometer. The results are shown in Table 1.

TABLE 1

|  | Examples | | | | Comparative Examples | |
|---|---|---|---|---|---|---|
|  | 1 | 2 | 3 | 4 | 1 | 2 |
| Component (A) wt. % | | | | | | |
| ε-Caprolactone-denatured 3,4-epoxycyclohexylmethyl-3',4'-epoxycyclohexane carboxylate*(1) | 20 | — | — | — | — | 20 |
| ε-Caprolactone-denatured 3,4-epoxycyclohexylmethyl-3',4'-epoxycyclohexane carboxylate*(2) | — | 17 | — | — | — | — |
| Trimethylcaprolactone-denatured 3,4-epoxycyclohexylmethyl-3',4'-epoxycyclohexane carboxylate*(3) | — | — | 17 | — | — | — |
| β-Methyl-δ-valerolactone-denatured 3,4-epoxycyclohexylmethyl-3',4'-epoxycyclohexane carboxylate*(4) | — | — | — | 17 | — | — |
| Component (B) wt. % Triarylsulfonium hexafluoroantimonate*(5) | 1 | 1 | 1 | 1 | 1 | 1 |
| Component (C) wt. % Trimethylolpropane triacrylate*(6) | 14 | 14 | 14 | 14 | 14 | 14 |
| Component (D) wt. % 1-Hydroxycyclohexyl phenyl ketone*(7) | 1 | 1 | 1 | 1 | 1 | 1 |
| Component (E) wt. % Propylene oxide adduct glycerin*(8) | 14 | 14 | 14 | 14 | 14 | — |
| Epoxy compound wt. % | | | | | | |
| 3,4-Epoxycyclohexylmethyl-3',4'-epoxycyclohexane carboxylate*(9) | 29 | 32 | 32 | 32 | 49 | 43 |
| Hydrogenated bisphenol A diglycidyl ether*(10) | 21 | 21 | 21 | 21 | 21 | 21 |
| Viscosity of the resin composition (25) cps | 380 | 410 | 400 | 420 | 380 | 350 |

The compounds represented by *(1)–*10) are as follows:
*(1): [CELOXIDE 2081], an epoxy compound represented by the formula (1) wherein m is 5 and n is 1.
*(2): [CELOXIDE 2083], an epoxy compound represented by the formula (1) wherein m is 5 and n is 3.
*(3): An epoxy compound represented by the formula (1) wherein m is 5 and n is 1.
*(4): An epoxy compound represented by the formula (1) wherein m is 4 and n is 1.
*(5): UV1-6974, manufactured by Union Carbide Corp.
*(6): VISCOAT 295, manufactured by Osaka Organic Chemical Industry Co., Ltd.
*(7): IRGACURE 184, manufactured by Ciba Geigy
*(8): SUNNIX GP-250, manufactured by Sanyo Chemical Indistries, Ltd.
*(9): UVR-6110, manufactured by Union Carbide Corp.
*(10): EPOLIGHT 4000, manufactured by Kyoeisha Chemical Industry Co., Ltd.

Evaluation of Photo-curable Resin Compositions

The photo-curable resin compositions prepared in Examples 1–4 and Comparative Examples 1 and 2 were evaluated by measuring the Young's modulus with time and the tensile elongation of the cured products. The dimensional accuracy of the resulting three-dimensional objects was also measured. The results are shown in Table 2.

Chance in Young's Modulus With Time
(1) Preparation of Test Specimens
A coated film with a thickness of 200 μm was prepared by applying a composition to a glass plate using an applicator.

The surface of the film was irradiated with ultraviolet light at a dose of 0.5 J/cm² using a conveyer curing apparatus equipped with a metal halide lamp to prepare a half-cured resin film. Next, the half cured resin film was peeled from the glass plate and placed on a releasable paper. The side opposite to that first cured by irradiation was irradiated with ultraviolet light at a dose of 0.5 J/cm² to prepare a completely cured resin film.

The cured resin film was allowed to stand under the atmospheric conditions described below to produce three test specimens (1) to (3).

Specimen (1) was prepared at a temperature of 23° C., under a humidity of 50% and allowed to stand in a thermo-hygrostat for 24 hours.

Specimen (2) was prepared at a temperature of 23° C., under a humidity of 50% and allowed to stand in a thermo-hygrostat for 30 days.

Specimen (3) was prepared at a temperature of 23° C., under a humidity of 80% and allowed to stand in a thermo-hygrostat for 30 days.

(2) Measurement of Young's Modulus

The Young's modulus of the test specimen was measured in a thermo-hygrostat at a temperature of 23° C. under a humidity of 50% at a drawing rate of 1 mm/min and a bench mark distance of 25 mm.

Rupture Tensile Elongation (1) Preparation of Test Specimens

Test specimens for measuring the tensile elongation were prepared in the same manner as in the preparation of the test specimens for measuring the change rate of the Young's modulus with time.

(2) Measurement

The tensile elongation of the test specimen was measured in a thermo-hygrostat at a temperature of 23° C. under a humidity of 50% at a drawing rate of 50 mm/min and a bench mark distance of 25 mm.

Figure 1:
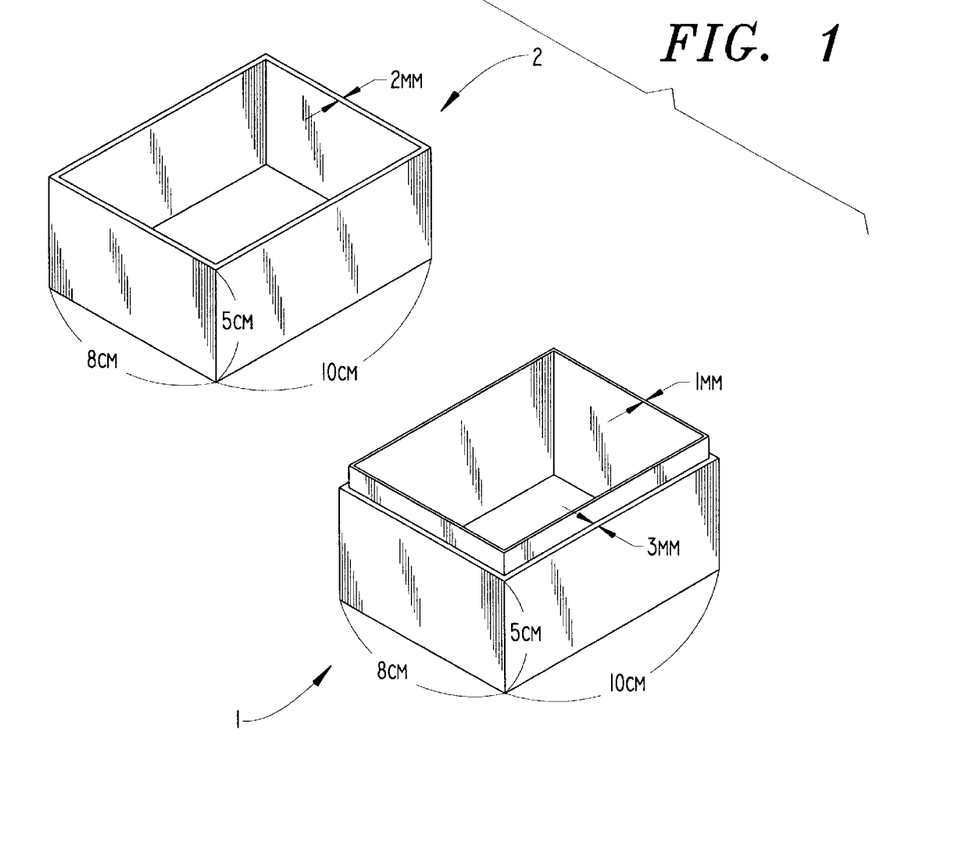
FIG. 1 is a perspective view of a three-dimensional object formed in accordance with the Examples and Comparative Examples.

Dimensional Accuracy of Three-dimensional Objects (1) Formation of Three-dimensional Objects By Fabricating The compositions prepared in Examples 1–4 and Comparative Examples 1, 2 were each molded using an photo-fabricating apparatus (Solid Creator JSC-2000, manufactured by Sony Corporation) under the conditions illustrated below to form a three-dimensional object consisting of a casing 1 and a cap 2, as shown in FIG. 1.

Molding Conditions

Laser beam intensity on the liquid surface: 100 mW

Scanning Velocity: the optimum velocity for the cured depth of the composition to be 0.3 mm.

Thickness of fabricated cured resin layer: 0.2 mm.

(2) Evaluation

The results of the evaluation was rated according to the following standard.

Good: When the cap 2 is fitted to the casing.

Bad: When the cap 2 is not fitted to the casing.

TABLE 2

|  | Example | | | | Comparative | |
| --- | --- | --- | --- | --- | --- | --- |
|  | 1 | 2 | 3 | 4 | 1 | 2 |
| Change in Young's modulus with time * | | | | | | |
| @ 23° C., 50% RH, 24 hrs. | 165 | 150 | 170 | 160 | 210 | 225 |
| @ 23° C., 50% RH, 30 days. | 155 | 140 | 160 | 155 | 220 | 190 |
| @ 23° C., 80% RH, 30 days. | 140 | 130 | 150 | 140 | 180 | 160 |

TABLE 2-continued

|  | Example | | | | Comparative | |
| --- | --- | --- | --- | --- | --- | --- |
|  | 1 | 2 | 3 | 4 | 1 | 2 |
| Tensile elongation (%) | 18 | 16 | 16 | 18 | 6 | 6 |
| Dimensional accuracy of three-dimensional object | Good | Good | Good | Good | Good | ** |

* (kg/mm)
** The three dimensional object could not be molded.

The photo-curable resin composition of the present invention can produce cured products having high mechanical strength, high dimensional accuracy, and excellent toughness.

Also, the photo-curable resin composition of the present invention can produce cured products having little change in mechanical strength with time.

In addition, the photo-fabricating process using the photo-curable resin composition of the present invention can provide a three-dimensional object possessing excellent primary characteristics, for example, mechanical strength and toughness, and high durability, for example, stability in shape and properties. The three-dimensional object of the present invention can therefore be suitably used as a trial product for mechanical parts. Also, the three-dimensional object can be used for a long period of time in a humid atmosphere.

What is claimed is:

1. A photo-curable resin composition comprising:
   (A) a compound represented by formula (1), (B) a cationic photo-initiator,
   (C) a monomer comprising at least one ethylenically unsaturated bond per molecule;
   (D) a radical photo-initiator, and
   (E) a polyol;
      wherein $R^1$ and $R^2$, which may be the same or different, individually represent a hydrogen atom, methyl group, ethyl group, isopropyl group, n-butyl group, sec-butyl group, or tert-butyl group, s is an integer from 1–7, and t is an integer from 1–20, provided that when there are two or more groups of $R^1$ or $R^2$ present, a plurality of $R^1$ or $R^2$ may be either the same or different; and
      wherein at least 60% of the ethylenically unsaturated monomer, relative to the total amount of ethylenically unsaturated monomer, has three or more ethylenically unsaturated bonds per molecule.

2. The photo-curable resin composition of claim 1, wherein the amount of component (A) present in said photo-curable resin composition is 5–60% by weight.

3. The photo-curable resin composition of claim 1, wherein the cationic photo-initiator (B) comprises at least one onium salt of formula 2:

wherein the cation is onium; Z represents S, Se, Te, P, As, Sb, Bi, O, I, Br, Cl, or N≡N; $R^3$, $R^4$, $R^5$, and $R^6$ represent individually the same or a different organic group; a, b, c, and d represent individually an integer from 0 to 3, and the sum of a, b, c, and d (=a+b+c+d) is equal to the valence number of Z; M represents a metal or metalloid selected from the group consisting of B, P, As, Sb, Fe, Sn, Bi, Al, Ca, In, Ti, Zn, Sc, V, Cr, Mn, and Co and X is a halogen atom; m represents an integer of at least 1 and n represents an integer of at least 1.

4. The photo-curable resin composition of claim 3, wherein the anion complex is selected from the group consisting of tetrafluoroborate($BF_3^-$), hexafluorophosphate ($PF_6^-$), hexafluoroantimonate ($SbF_6^-$), hexafluoroarsenate ($AsF_6^-$), and hexachloroantimonate ($SbCL_6^-$).

5. The photo-curable resin compound of claim 3, wherein the cationic photo-initiator (B) is an onium salt containing an anion selected from the group consisting perchloric acid ion ($ClO_4^-$), trifluoromethane sulfonate ion ($CF_3SO_3^-$), fluorosulfonate ion ($FSO_3^-$), toluene sulfonate anion, trinitrobenzene sulfonate anion and trinitrotoluene sulfonate anion.

6. The photo-curable resin composition of claim 1, wherein the photo-initiator (B) is an onium salt containing an anion represented by the general formula wherein M represents a metal or metalloid selected from the group consisting of B, P, As, Sb, Fe, Sn, Bi, Al, Ca, In, Ti, Zn, Sc, V, Cr, Mn, and Co and X is a halogen atom; and y represents an integer of at least 1.

7. The photo-curable resin composition of claim 1, wherein the photo-initiator (B) is present in an amount of 0.1–10% by weight.

8. The photo-curable resin composition of claim 1, wherein the ethylenically unsaturated monomer (C) is present in an amount of 5–40% by weight of the total composition.

9. The photo-curable resin composition of claim 1, wherein the radical photo-initiator (D) is present in an amount of 0.01–10% by weight.

10. A photo-curable resin composition comprising:

(A) a compound represented by formula (1), (B) a cationic photo-initiator, (C) an ethylenically unsaturated monomer,

(D) a radical photo-initiator, and (E) a polyol having 2–6 hydroxyl groups per molecule;

wherein $R^1$ and $R^2$, which may be the same or different, individually represent a hydrogen atom, methyl group, ethyl group, isopropyl group, n-butyl group, sec-butyl group, or tert-butyl group, s is an integer from 1–7, and t is an integer from 1–20, provided that when there are two or more groups of $R^1$ or $R^2$ present, a plurality of $R^1$ or $R^2$ may be either the same or different.

11. A photo-curable resin composition comprising:

(A) a compound represented by formula (1), (B) a cationie photo-initiator, (C) an ethylenically unsaturated monomer, (D) a radical photo-initiator, and (E) a polyol;

(F) one or more cationically polymerizable compounds selected from the group consisting of oxetane compounds, oxalan compounds, cyclic acetal compounds, lactone compounds, thiirane compounds, thietane compounds, vinylether compounds and spiro-ortho ester compounds;

wherein $R^1$ and $R^2$, which may be the same or different, individually represent a hydrogen atom, methyl group, ethyl group, isopropyl group, n-butyl group, sec-butyl group, or tert-butyl group, s is an integer from 1–7, and t is an integer from 1–20, provided that when there are two or more groups of $R^1$ or $R^2$ present, a plurality of $R^1$ or $R^2$ may be either the same or different.

* * * * *